United States Patent [19]
Yamazaki

[11] Patent Number: 5,306,940
[45] Date of Patent: Apr. 26, 1994

[54] SEMICONDUCTOR DEVICE INCLUDING A LOCOS TYPE FIELD OXIDE FILM AND A U TRENCH PENETRATING THE LOCOS FILM

[75] Inventor: Toru Yamazaki, Tokyo, Japan

[73] Assignee: NEC Corporation, Tokyo, Japan

[21] Appl. No.: 779,878

[22] Filed: Oct. 21, 1991

[30] Foreign Application Priority Data

Oct. 22, 1990 [JP] Japan ............................ 2-284733

[51] Int. Cl.⁵ .................... H01L 27/02; H01L 27/04; H01L 29/06
[52] U.S. Cl. .................................. 257/374; 257/370; 257/397; 257/398; 257/514; 257/513
[58] Field of Search ............... 257/374, 395, 397, 398, 257/510, 513, 514

[56] References Cited

U.S. PATENT DOCUMENTS

| | | | |
|---|---|---|---|
| 4,104,086 | 8/1978 | Bondur et al. | 257/510 |
| 4,506,435 | 3/1985 | Pliskin et al. | 257/513 |
| 4,551,743 | 11/1985 | Murakami et al. | 257/513 |
| 4,746,963 | 5/1988 | Uchida et al. | 257/513 |
| 4,835,115 | 5/1989 | Eklund | 257/510 |
| 5,099,304 | 3/1992 | Takemura et al. | 257/397 |

OTHER PUBLICATIONS

C. T. Chuang et al, "On The Scaling Property of Trench Isolation Capacitance for Advanced High-Performance ECL Circuits", 1989 IEEE, IEDM 89-799-802.

M. Sugiyama et al, "Bipolar VLSI Memory Cell Technology Utilizing BPSG-filled Trench Isolation", VLSI Development Division, Bipolar LSI Division, NEC Corporation, pp. 59-60.

Y.-C. Simon Yu et al., "Planarized Deep-Trench Process for Self-Aligned Double Polysilicon Bipolar Device Isolation", *J. Electrochem. Soc.*, vol. 137, No. 6, Jun. 1990, pp. 1942-1950.

*Primary Examiner*—Gene M. Munson
*Attorney, Agent, or Firm*—Sughrue, Mion, Zinn, Macpeak & Seas

[57] ABSTRACT

In a semiconductor device having an element isolation region including a LOCOS type field oxide film formed in a surface of a silicon substrate and a U-trench isolation region provided in the silicon substrate, the U-trench isolation region is constituted with a U-trench provided such that it penetrates the field oxide film, a channel stopper provided in a portion of the silicon substrate exposed on a bottom face of the U-trench, a first film in a form of a silicon oxide film formed by thermal oxidation of an exposed portion of the silicon substrate in the U-trench, a second film comprising a buried layer having thermal reflow characteristics and burying the U-trench, a third film having non-thermal reflow characteristics and having a top face substantially coplanar with a top face of the field oxide film and a bottom face connected to a top face of the second films and a fourth film in a form of an insulating film connected to the top face of the third film at an upper end of said U-trench and covering the U-trench. In the element isolation region having this structure, there is no leakage current produced due to thermal oxidation of a polysilicon film buried in the U-trench, contrary to the conventional U-trench isolation region having buried polysilicon film. Further, increase of parasitic capacitance which is caused by thermal oxidation of the buried polysilicon layer can be also restricted.

13 Claims, 12 Drawing Sheets

SEMICONDUCTOR DEVICE INCLUDING A LOCOS TYPE FIELD OXIDE FILM AND A U TRENCH PENETRATING THE LOCOS FILM

BACKGROUND OF THE INVENTION

1. Field of the Invention

The present invention relates to a semiconductor device and, particularly, to an element isolation region of a semiconductor device, which is composed of a LOCOS type field oxide film and a U-trench isolation region.

2. Description of the Prior Art

The LSI of semiconductor device on a silicon substrate has been realized by providing element isolation regions each between adjacent ones of a plurality of transistors. Such element isolation region to be used in a semiconductor device includes P-N junction isolation region, field oxide film such as LOCOS field oxide film and U-trench isolation region, etc. The P-N junction isolation region and the U-trench isolation region are isolation regions for elements having such deep P-N junction as in a collector region of a bipolar transistor. On the other hand, the field oxide film provides an isolation region for elements having shallow P-N junction such as between an element formed on a silicon substrate surface and a wiring formed on the substrate or between a source-drain region of a MOS transistor.

Thus, for the element isolation region of a semiconductor device comprising MOS transistor, the field oxide film is used and, for the element isolation of semiconductor device comprising bipolar transistor, combination of the P-N junction or U-trench isolation and the field oxide film. With decrease of element size, the LOCOS type field oxide film and the combination of the LOCOS type field oxide film and the U-trench isolation region is used mainly for a semiconductor device comprising MOS transistor and for a semiconductor device comprising bipolar transistor, respectively, in views of self-alignment and reduction of element isolation region.

In a semiconductor device including a MOS transistor, the MOS transistor was a P channel MOS transistor, firstly, and, then, an N channel MOS transistor was used and, currently, a MOS transistor is used mainly. The semiconductor device using a CMOS transistor employed initially an N well or a P well and now employs an N well and a P well. Therefore, in the semiconductor device including MOS transistor, an element isolation region for isolating the N well from the P well, both having deep P-N junctions, is necessary and, further, for latch-up problem, the use of a U-trench isolation region is becoming considered. Further, in view of a BICMOS transistor composed of a CMOS transistor and a bipolar transistor which is becoming popular, the necessity of element isolation region including a LOCOS type field oxide film and a U-trench isolation region is increasing.

Now, a conventional element isolation region including a LOCOS type field oxide film and a U-trench isolation region will be described. Such element isolation region comprises a field oxide film formed on a silicon substrate surface by a LOCOS process, a U-trench penetrating the field oxide film into the silicon substrate, a channel stopper provided on a surface portion of the silicon substrate which is a bottom face of the U-trench, an insulating film covering a surface of the silicon substrate portion constituting a wall of the U-trench, a filler in the U-trench and an insulating film filling the U-trench up to an upper end of the U-trench. The filler is usually of a polysilicon film. In this structure, the insulating film burying the U-trench to close the upper end thereof is formed by thermal oxidation of this polysilicon film which is connected to the field oxide film. With the connection of these oxide films, a surface flatness of the element isolation region is maintained to some extent which will be described later. The insulating film covering the wall of the U-trench comprise a silicon oxide film obtained by, for example, oxidizing a surface of silicon substrate. The channel stopper is formed by impurity ion injection of the same conductivity type as that of the silicon substrate to the bottom face of the U-trench, after the latter is formed by etching.

There are two typical methods for fabrication of such element isolation region. These methods will be described by taking an element isolation region for a NPN bipolar transistor as an example.

The first method comprises the following steps: An N+ buried layer is formed in a surface of a P type silicon substrate and an N type epitaxial layer is formed on the P type silicon substrate surface including an N+ type buried layer. A field oxide film of LOCOS type is formed on a surface of the epitaxial layer. Then, a U-trench penetrating the field oxide film, the N+ type epitaxial layer and the N type buried layer is formed by etching. A silicon oxide film covering portions of the N type epitaxial layer and the N+ type buried layer and a surface portion of the P type silicon substrate exposed on a wall of the U-trench is formed by thermal oxidation. A P type channel stopper is formed on a surface portion of the P type silicon substrate exposed on a surface portion of the P type silicon substrate exposed on a bottom face of the U-trench, by ion-injection of boron. On the whole surface of this wafer, a non-doped polysilicon film is deposited by a CVD process. The polysilicon film is etched back, leaving a portion thereof within the U-trench. On a top face of the polysilicon film, a silicon oxide film is formed by thermal oxidation by which the upper end of the U-trench is closed.

According to the second method, an N+ type buried layer is formed in a surface of a P type silicon substrate and, then, an N type epitaxial layer is formed on the surface of the P type silicon substrate including the N+ type buried layer. A silicon oxide film is formed on a surface of the N type epitaxial layer by a CVD process. Portions of the silicon oxide film on a region in which a U-trench is to be formed are removed. With using the silicon oxide film as an etch mask, the N type epitacial layer, the N+ type buried layer and the P type silicon substrate are etched in the order, resulting in a U-trench. A P type channel stopper is formed on the P type silicon substrate exposed on a bottom face of the U-trench by ion injection of boron. The silicon oxide film used as the mask in the etching step is removed. A silicon oxide film is formed on the N+ type buried layer, the P type silicon substrate and the N type epitaxial layer which are exposed on the wall of the U-trench, by thermal oxidation. On the whole surface, a non-doped polysilicon film is deposited by a CVD process. The polysilicon film is etched back, leaving a portion thereof within the U-trench. On the whole surface, a pad oxide film and a silicon nitride film are formed. A portion of the silicon nitride film on an area in which a field oxide film is to be formed is removed. The field oxide film is formed on the N type epitaxial layer by a LOCOS process, and a silicon oxide film is formed on an upper end of the U-trench by thermal oxidation of the polysilicon film surface. The remaining silicon nitride film and the pad oxide film are removed.

In the first method, the top face of the silicon oxide film formed by thermal oxidation of the polysilicon film buring the U-trench and closing the upper end of the U-trench, hardly becomes coplanar with the top face of the field oxide film, resulting in a step at a joining portion therebetween. In the second method, a recess is formed at a junction between the silicon oxide film closing the upper end of the U-trench and the field oxide film. That is, in these methods, it is difficult to obtain a complete flatness at the junction of these oxide films. In this case, breakage of a wiring formed on the junction area tends to occur.

In order to solve these problems, a third method has been proposed by y.-C. Simon Yu, et al. on J. Elecytochem. Soc., Vol. 137, No. 6, pp 1942-1950, (1990). According to this proposal, the LOCOS field oxide film is formed in two steps. First, a first field oxide film is formed on a top face of the polysilicon film burying the U-trench. Then, a second field oxide film is formed in an area adjacent to the first field oxide film.

In detail, in the third method, an N+ buried layer is formed on a P type silicon substrate and an N type epitaxial layer is formed on the P type silicon substrate surface including the N+ type buried layer. A pad oxide film and a silicon nitride film are formed on a surface of the N type epitaxial layer. Portions of the silicon nitride film and the pad oxide film on an area in which the U-trench is to be formed are removed by etching and, then, the N type epitaxial layer, the N+ type buried layer and the P type silicon substrate in the same area are etched in sequence, resulting in the U-trench. In this series of etching steps, the pad oxide film is under cut. A channel stopper is formed on a surface of the P type silicon substrate exposed on bottom face of the U-trench by ion injection of boron. A silicon oxide film is formed on the surfaces of the N type epitaxial layer, the N+ type buried layer and the P type silicon substrate exposed on a wall of the U-trench by thermal oxidation. This silicon oxide film is connected to the pad oxide film in the vicinity of the upper end of the U-trench. On the whole surface, a non-doped polysilicon film is deposited by a CVD process. The polysilicon film is etched back such that the portion thereof within the U-trench is left as it is. The first field oxide film is formed on the surface of the polysilicon film by a LOCOS process using the silicon nitride film as a mask. A portion of the silicon nitride film on an area in which the second field oxide film is to be formed is removed by etching and, then, by using a LOCOS process again, the second field oxide film connected to the first film oxide film is formed on the N type epitaxial layer. In the junction between the first and second field oxide films, there is no step or recess formed. Therefore, it is possible to obtain a substantially complete flatness in the junction area.

In the conventional element isolation region including the LOCOS type field oxide film and the U-trench isolation region which is buried with the polysilicon film, the flatness of the surface of element isolation region including the junction area of these two isolation regions is maintained. However, there is a problem in the U-trench isolation region which is buried with the polysilicon film, regardless of the the structure and formation of the field insulating film. That is, the problem resides in the formation of the silicon oxide film on the upper end of the U-trench by the thermal oxidation of the top face of the polysilicon film burying the U-trench. In the thermal oxidation, the polysilicon film expands in volume with expansion coefficient of about 1.5 times that of the surrounding silicon, so that stress is exerted on silicon crystal surrounding the polysilicon film and crystal defects may be formed, resulting in leakage current. Further, parasitic capacitance between regions adjacent to each other through the U-trench is not reduced by the presence of the polysilicon film burying the U-trench. The parasitic capacitance may be increased if the polysilicon film which is non-doped, is doped with conductive impurity.

N. Sugiyama et al. propose in 1989 Symposium on VLSI Technology Digest papers, pp 59-60, a method for solving the problem caused by the volume expansion of polysilicon in a U-trench isolation region. In this article, a LOCOS type field oxide film is not used, and, instead thereof, a field insulating film is formed on a silicon substrate surface by a CVD process after a U-trench is formed. The U-trench is buried with a BPSG film. A bipolar transistor is formed by using the U-trench isolation region filled with the BPSG film and an emitter-collector leakage current was measured. A result showed a substantial improvement of leakage current, compared with a bipolar transistor with the U-trench isolation region filled with a polysilicon film.

The formation of the U-trench isolation region buried with BPSG film is summarized as below: A U-trench is formed in a predetermined portion of a silicon substrate by etching the portion. On a silicon surface including the silicon substrate exposed on a wall of the U-trench is thermally oxidized to form a silicon oxide film. A silicon nitride film is deposited thereon. A BPSG film is deposited thereon by a CVD process and a surface of the BPSG film is flattened by heat treatment. The BPSG film is etched back to make a top face thereof and an upper end of the U-trench coplanar. The purpose of the silicon oxide film is to obtain a good contact of the silicon nitride film and the purpose of the silicon nitride film is to protect the silicon substrate against the etch back of the BPSG film. Further the silicon oxide film and the silicon nitride film serve to prevent diffusion of boron and phosphor from the BPSG film to the silicon substrate during the heat-treatment of the BPSG film. This formation utilizes the thermal reflow characteristics of the BPSG film.

The element isolation of proposed by M. Sugiyama et al. is not advantageous in reducing the size of semiconductor element. For example, when a bipolar transistor is formed, it is necessary to separately form a hole of a field insulating film for forming a collector plug region and holes of the field oxide film for forming an emitter region and a base region. This means that it is impossible to use a self-alignment scheme. Thus, the number of photolithographic steps is increased and the alignment margin of photo masks is increased. These problems become severe when a semiconductor includes MOS transistor.

It is not practical to merely combine a U-trench isolation region according to Sugiyama et al, and a LOCOS field oxide film. That is, when such combination is used, a pad oxide film and a silicon nitride film are formed on a surface of a silicon substrate. Then, a portion of the silicon nitride film on an area of the substrate surface in which a field oxide film is to be formed is etched away. After the field oxide film is formed thereon by a LOCOS process, portions of the field oxide film and the silicon substrate in an area in which a U-trench is to be formed are etched away, resulting a U-trench. Then, a silicon oxide film is formed on a portion of the silicon substrate exposed on the wall of the U-trench by thermal oxidation and, thereafter, a BPSG film is deposited on the whole surface by a CVD process and its surface is flattened by the heat treatment. Then, the BPSG film is etched back to make a top face of the BPSG film substantially coplanar with an upper end of the U-trench, leaving the BPSG film on the pad oxide film. In order to completely remove the BPSG film on the pad oxide film by etch back thereof, the top face of the BPSG film becomes lower than the upper end of the U-trench. As such, even if an insulating film covering the top face of the BPSG film is formed, there is a step between the field oxide film and the BPSG film, causing a wiring passing over the U-trench isolation region to be easily broken.

BRIEF SUMMARY OF THE INVENTION

Object of the Invention

An object of the present invention is to provide an element isolation regions of a semiconductor device, which is effective to reduce element size.

Another object of the present invention is to provide an element isolation region of a semiconductor device in which leakage current is minimized.

A further object of the present invention is to provide element isolation region of a semiconductor device in which parasitic capacitance is minimized.

A still further object of the present invention is to provide an element isolation region having a structural surface flat enough to provide a semiconductor device having wiring breakage minimized.

Another object of the present invention is to provide an element isolation region including a LOCOS field oxide film and a U-trench isolation region.

Another object of the present invention is to provide an element isolation region including a LOCOS field oxide film and a U-trench isolation region to thereby provide a semiconductor device suitable for reduction of the size thereof.

Another object of the present invention is to provide an element isolation region including a LOCOS field oxide film and a U-trench isolation region to thereby provide a semiconductor device having leakage current minimized.

Another object of the present invention is to provide an element isolation region including a LOCOS field oxide film and a U-trench isolation region to thereby provide a semiconductor device having minimized parasitic capacitance.

SUMMARY OF THE INVENTION

In a semiconductor device which comprises an element isolation region including a LOCOS type field oxide film formed on a surface of a silicon substrate, a U-trench penetrating the field oxide film and having a bottom face at least reaching the below substrate, a channel stopper provided on a portion of the silicon substrate exposed in the bottom face, a first film in a form of insulating film provided on a portion of the silicon substrate exposed on a wall of the U-trench, a second film burying an interior of the U-trench, the semiconductor device according to the present invention comprises:

the first film being a silicon oxide film formed by thermal oxidation of the exposed portion of the U-trench;

the second film being an insulating film having thermal reflow characteristics and burying the U-trench;

a third film comprising a film having a top face substantially coplanar with a top face of the field oxide film and a bottom face connected to the top face of the second film and burying the U-trench, the third film having non-thermal reflow characteristics; and a fourth film which is an insulating film connected to the top face of the third film at an upper end of the U-trench and covering the upper end of the U-trench.

The second film is, preferably, a PSG or BPSG film. The top face of the second film is preferably in between the top and bottom faces of the field oxide film. The third film is preferably a silicon oxide film or a non-doped polysilicon film formed by a CVD process. The fourth film is preferably a silicon nitride film formed by a CVD process or a silicon oxide film formed by a high temperature CVD process. When the third film is the non-doped polysilicon film, it is preferably to provide a fifth film of silicon nitride formed by a CVD process and covering surface portions of the field oxide film and the first film exposed on the wall of the U-trench or a sixth film of silicon nitride formed by a CVD process and covering a wall portion of the U-trench on which there is no second film.

The silicon substrate is, preferably, constituted with a silicon substrate of one conductivity type and a well of the other conductivity type. In such case, the U-trench penetrates side faces of the wall and the bottom face of the U-trench is lower in position than the bottom face of the well.

Alternatively, the silicon substrate is, preferably, constituted with a silicon substrate of one conductivity type, a well of the other conductivity type and a well of the one conductivity type. In this case, the U-tranch, preferably, penetrates side faces of the both wells and the bottom face of the U-trench is lower in position than the bottom faces of the both wells.

Alternatively, the silicon substrate is, preferably, constituted with a silicon substrate of one conductivity type, a buried layer of the other conductivity type and an epitaxial layer of the other conducting type. In such case, the U-trench, preferably, penetrates the buried layer.

Alternatively, the silicon substrate is, preferably, constituted with a silicon substrate of one conductivity type, a buried layer of the other conductivity type, a buried layer of the one conductivity type and an epitaxial layer of the other conductivity type and, preferably, the U-trench penetrates the buried layers of the one and other conductivity types.

Alternatively, the silicon substrate is, preferably, constituted with a silicon substrate of one conductivity type, a buried layer of the other conductivity type, a buried layer of the one conductivity type, an epitaxial layer of the other conductivity type and a well of the one conductivity type, the well being connected to the buried layer of the one conductivity type and formed on the epitaxial layer. Preferably, the U-trench penetrates side faces of the well of the one conductivity type and the buried layers of the one and the other conductivity types.

Alternatively, the silicon substrate is, preferably, constituted with a silicon substrate of one conductivity type, a buried layer of the other conductivity type, a buried layer of the one conductivity type, an epitaxial of the other conductivity type, a well of the one conductivity type connected to the buried layer of the one conductivity type and formed on the epitaxial layer of the other conductivity type and a well of the other conductivity type connected to a portion of the buried layer of the other conductivity type and provided on the epitaxial layer of the other conductivity type formed thereon. In this case, the U-trench, preferably, penetrates the side faces of the wells and the buried layers.

In the semiconductor device according to the present invention which has an element isolation region composed of a LOCOS type field oxide film and a U-trench isolation region, reduction of size of semiconductor element can be easily realized. Further, in the semiconductor device of the present invention, diffusion of impurity from the second film to the silicon substrate is prevented by the first film of silicon oxide formed by thermal oxidation. With the second film having non-thermal reflow characteristics, stress generation during heat treatment for flattening purpose is relaxed and generation of crystal defects in a portion of the silicon substrate adjacent to the U-trench is restricted. Therefore, generation of leakage current is reduced compared with the conventional U-trench isolation region buried with polysilicon film. Further, the semiconductor device according to the present invention which uses the insulating film as the second film have a reduced parasitic capacitance between regions facing to each other though the U-trench, compared with the conventional U-trench region. Further, the semiconductor devices of the present invention in which the third film is provided on the second film has a flattened surface since the top face of the U-trench isolation region is substantially coplanar with the top face of the field oxide film. The third film serves to prevent an out diffusion from the second film and to protect the second film against various subsequent etching steps. Further, in the present semiconductor device, the fourth film protects the third film against subsequent various etching and diffusion steps. Although the fourth film provides sharp steps at its formation, such sharp steps are substantially smoothened by subsequent etching and deposition of interlayer insulating films, etc. and does not contribute to generation of breakage of a wiring provided thereon.

BRIEF DESCRIPTION OF THE DRAWINGS

The above-mentioned and other objects, features and advantages of the present invention will become more apparent by reference to the following detailed description of the invention taken in conjunction with the accompanying drawing, wherein.

DETAILED DESCRIPTION OF THE PREFERRED EMBODIMENTS

Before describing embodiments of the present invention, the conventional technique will be described in more detail with reference to the drawings to clarify how the present invention is come true.

In a case where an element isolation region of a semiconductor device is composed of a LOCOS type field oxide film and a U-trench buried with a polysilicon film, the newest technique in which the flatness of a surface of the element isolation region is taken into consideration is that proposed by Y. -C. Simon Yu, et al. which was briefly described previously. The content of this proposal will be described in more detail with reference to FIGS. 1A to 1D.

Figure 1A:
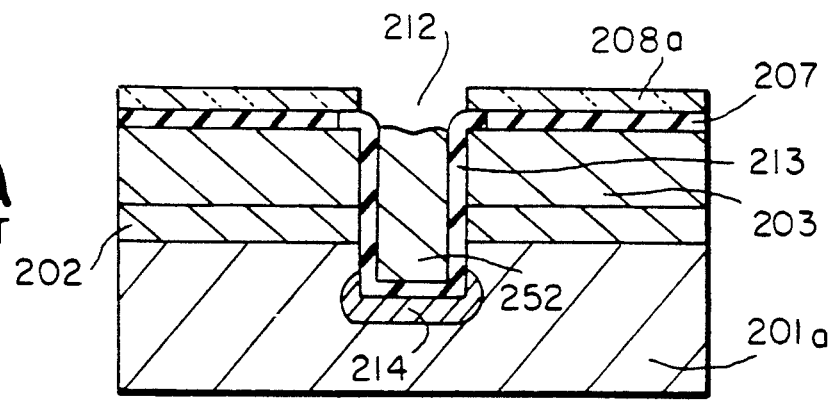
FIGS. 1A to 1D are cross sections of a conventional element isolation region of a semiconductor device, which is composed of a LOCOS type field oxide film, and a U-trench isolation region buried in the polysilicon film, showing steps of formation thereof.
Figure 1B:
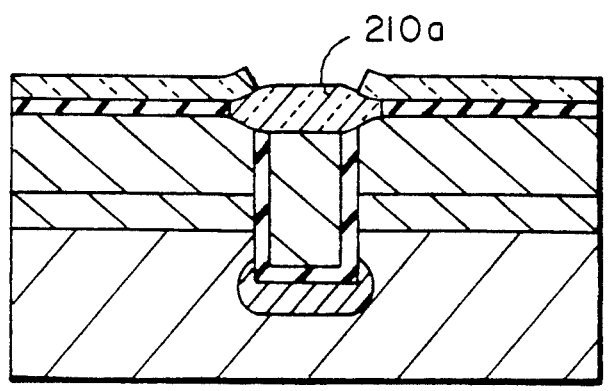
Figure 1C:
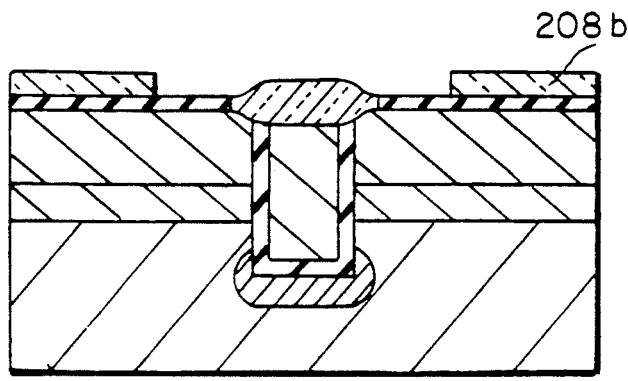
Figure 1D:
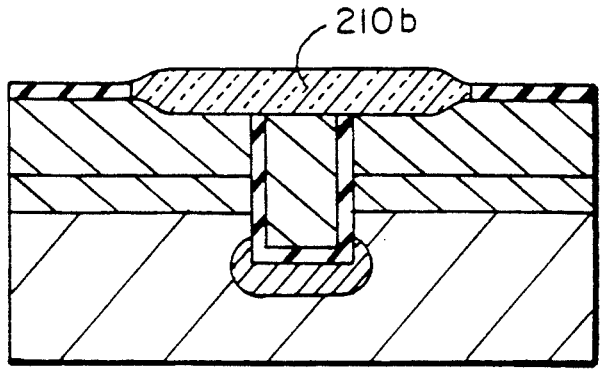

On a P type silicon substrate 201a, an N+ type buried layer 202 is formed. The LOCOS field oxide film is formed in two steps. An N type epitaxial layer 203 is formed on a surface of the P type silicon substrate surface 201a including the N+ type buried layer 202. A pad oxide film 207 and a silicon nitride film 208a are formed on a surface of the N type epitaxial layer 203. Portions of the silicon nitride film 208a and the pad oxide film 207 on an area in which the U-trench is to be formed are removed by etching sequentially and, then, the N type epitaxial layer 203, the N+ type buried layer 202 and the P type silicon substrate 201a in the same area are etched in sequence, resulting in the U-trench 212. In this series of etching steps, the pad oxide film 207 is under cut. A channel stopper 214 is formed on a surface of the P type silicon substrate 201a exposed on bottom face of the U-trench 212 by ion injection of boron. A silicon oxide film 213 is formed on surface of the N type epitaxial layer 203, the N+ type buried layer 202 and the P type silicon substrate 203 exposed on a wall of the U-trench 212 by thermal oxidation. This silicon oxide film 213 is connected to the pad oxide film 207 in the vicinity of the upper end of the U-trench 212. On the whole surface, a non-doped polysilicon film is deposited by a CVD process. The polysilicon film is etched back such that the portion 252 thereof within the U-trench is left as it is (FIG. 1A). A field oxide film 210a is formed on the surface of the polysilicon film 252 by a LOCOS process using the silicon nitride film 208a as a mask (FIG. 1B). A portion of the silicon nitride film 208a on an area adjacent to the field oxide film 210a is removed by etching to leave a silicon nitride film 208b (FIG. 1C). By using the LOCOS process with the silicon nitride film 208b being a mask, a field oxide film 210b is formed on an area including the surface of the N type epitaxial layer (FIG. 1D). The field oxide film 210b includes the field oxide film 210a and there is no step portion or recess portion formed on the surface of the field oxide film 210b. As a result, an element isolation region has a substantially flat surface.

There are two important defects in the U-trench isolation region buried with polysilicon film. One of them is due to thermal oxidation of a top face of the polysilicon buried layer. That is, leakage current is increased due to volume expansion of the buried layer during thermal oxidation. The other problem is an increase of parasitic capacitance due to polysilicon film itself. As mentioned previously, N. Sugiyama et al. proposes a method for solving the problem caused by the volume expansion in a U-trench isolation region. (In Sugiyama, et al., a LOCOS type field oxide film is not used, and, instead thereof, a field insulating film is formed on a silicon substrate surface by CVD after U-trench is formed). The U-trench is buried with a BPSG film. The method of Sugiyama, et al. will be described briefly with reference to FIGS. 2A to 2C.

Figure 2A:
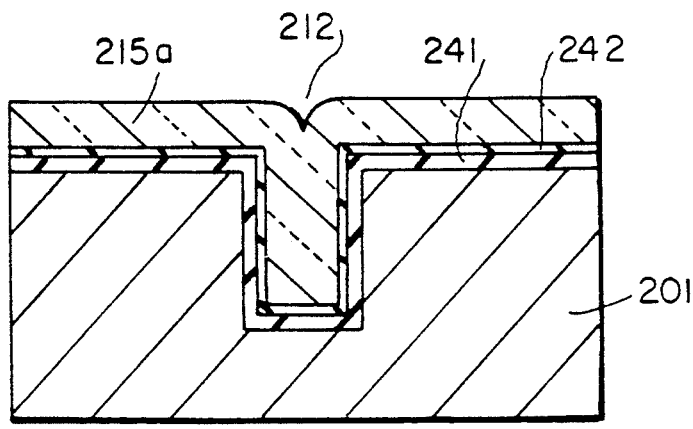
FIGS. 2A to 2C are cross sections of another conventional element isolation region of semiconductor device, which includes a U-trench isolation region buried with a BPSG film showing formation thereof.
Figure 2B:
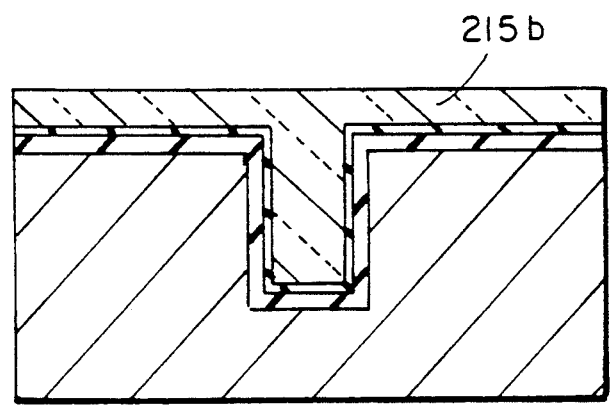
Figure 2C:
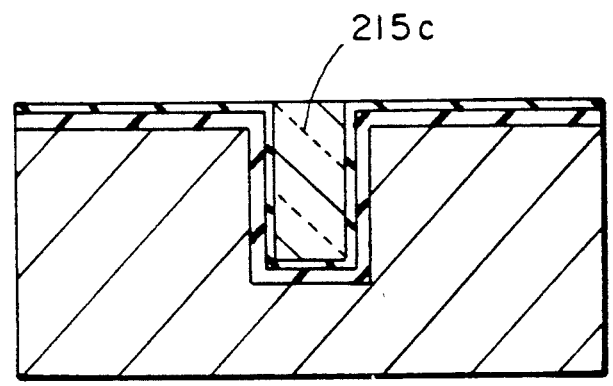

A U-trench 212 is formed by etching a predetermined area of a silicon substrate 201. A silicon oxide film 241 is formed on a surface of the silicon substrate 201 including an exposed portion thereof in the U-trench 212 by thermal oxidation. A silicon nitride film 242 is deposited on a surface of the silicon oxide film 241. On a whole surface, a BPSG film 215a is deposited by a CVD process (FIG. 2A). A BPSG film 215b having a flat surface is formed by heat treatment (FIG. 2B). The BPSG film 215b is etched back to leave only a BPSG film 215c in the U-trench 212. At this time, a top face of the BPSG film 215c is made substantially coplanar with an upper end of the U-trench 212 (FIG. 2C). The purpose of the silicon oxide film 241 is to obtain a good contact of the silicon nitride film 242. The silicon nitride film 242 is to protect the silicon substrate 201 against the etching back of the BPSG film 215b. Further the silicon oxide film 241 and the silicon nitride film 242 serve to prevent diffusion of boron and phosphor from the BPSG film 215a to the silicon substrate 201 during the heat-treatment of the BPSG film 215a. This formation utilizes the thermal reflow characteristics of the BPSG film.

Sugiyama, et al. formed a bipolar transistor using the U-trench buried with the BPSG film and measured leakage current between an emitter and a collector thereof. The result showed a substantial improvement on leakage current compared with a bipolar transistor having the U-trench isolation region buried with polysilicon film. Although not mentioned by Sugiyama et al., his structure is effective in restriction of parasitic capacitance increase. However, the element isolation region proposed by Sugiyama et al. does not provide an enough contribution to reduction of size of semiconductor element. For example, when a bipolar transistor is formed, a hole of the field oxide film for forming a collector plug region and a hole thereof for forming an emitter region are formed separately. This means that it is impossible to use a self-alignment scheme. Thus, the number of photolithographic steps is increased and the alignment margin of photo masks is increased. These problems become severe when a semiconductor includes MOS transistor.

It is not practical to merely combine a U-trench isolation region according to Sugiyama et al, and a LOCOS field oxide film. This will be described with reference to FIGS. 3A and 3B.

Figure 3A:
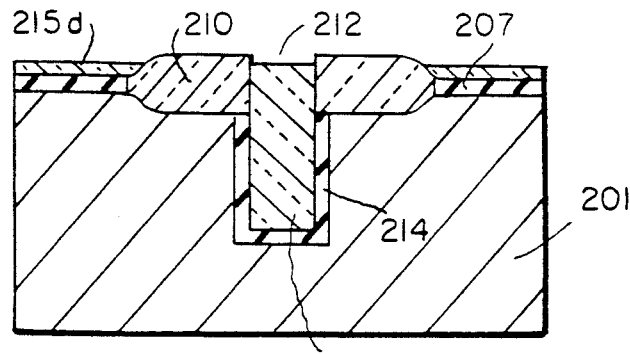
FIGS. 3A and 3B are cross sections of an element isolation region which a combination of the LOCOS type field oxide film and the conventional U-trench isolation region buried with a BPSG film, for explaining a porblem thereof.
Figure 3B:
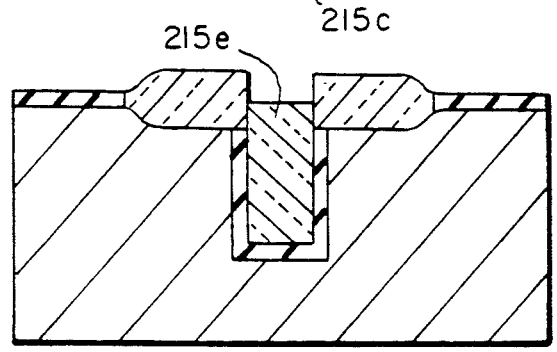

A pad oxide film 207 and a silicon nitride film (not shown) are formed in a surface of a silicon substrate 201. A portion of the silicon nitride film on an area in which the field oxide film is to be formed is etched away. The field oxide film 210 is formed thereon by a LOCOS process, portions of the field oxide film 210 and the silicon substrate 201 in an area in which a U-trench is to be formed are etched away, the U-trench 212 is formed thereon. A silicon oxide film 214 is formed on a portion of the silicon substrate 201 exposed on the wall of the U-trench 212 by thermal oxidation, a BPSG film is deposited on the whole surface by a CVD process and its surface is flattened by the heat treatment. Then the BPSG film is etched back to leave only a BPSG film 215c in the U-trench 212. At this stage, a top face of the BPSG film 215c is made substantially coplanar with an upper end of the U-trench 212, leaving a BPSG film 215d on the pad oxide film 207 (FIG. 3A). By etching back the BPSG film 215d on the pad oxide film 207 to remove it completely, the top face of the BPSG film 215e becomes lower than the upper end of the U-trench 212 (FIG. 3B). In this case, even if an insulating film covering the top face of the BPSG film 215e is formed, there is a step between the field oxide film 210 and the BPSG film 215e, causing a wiring passing over the U-trench isolation region to be easily broken.

The present invention is based on the above-mentioned proposal of N. Sugiyama et al. and resides in an element isolation region in which a combination of a LOCOS type field oxide film and a U-trench isolation region buried with an insulating film such as BPSG film, having thermal reflow characteristics is used.

The present invention will now be described with reference to the drawings.

Figure 4A:
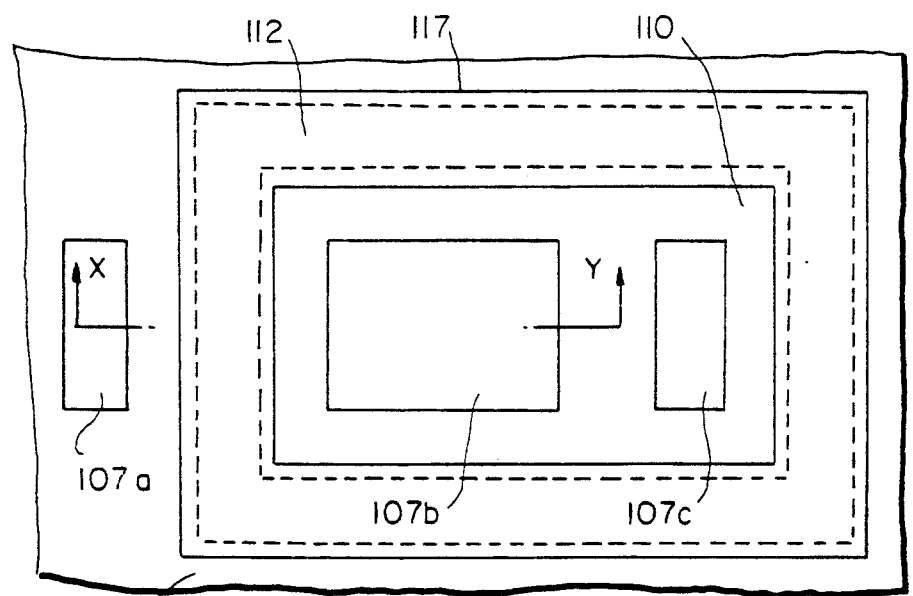
FIG. 4A is a plane view of an embodiment of the present invention.
Figure 4B:
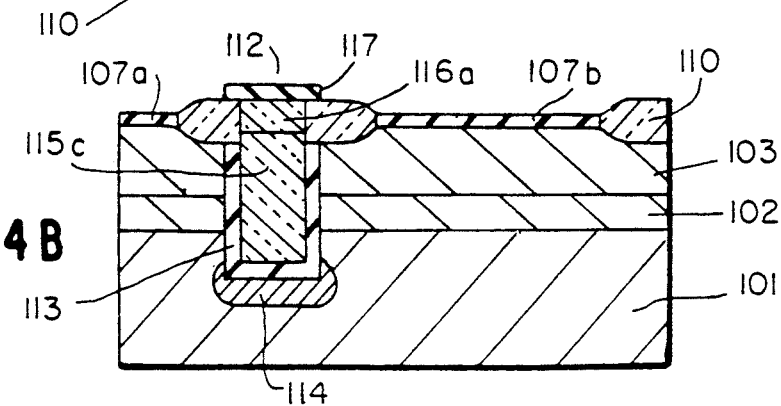
FIG. 4B is a cross section taken along a line X-Y in FIG. 4A.

Referring to FIGS. 4A and 4B which are a plan view and a cross sectional view of a first embodiment of the present invention, respectively, a semiconductor device according to the present invention includes element isolation regions each composed of a LOCOS type field oxide film 110 formed on a N type epitaxial layer 103 which is formed on an N+ type buried layer 102 formed on a P type silicon substrate 101 and a U-trench isolation region.

The LOCOS type field oxide film 110 is selectively formed on the surface of the N type epitaxial layer 103 and, on a surface portion of the latter on which the field oxide film 110 is not formed, pad oxide films 107a, 107b, and 107c, etc. are formed. Impurity density of the P type silicon substrate 101 is $1 \times 10^{15}$ to $1 \times 10^{16}$ cm$^{-3}$. Impurity density of the N+ buried layer 102 is $1 \times 10^{20}$ to $1 \times 10^{21}$ cm$^{-3}$. That of the N type epitaxial layer 103 is $1 \times 10^{15}$ to $1 \times 10^{17}$ cm$^{-3}$ and the thickness of the epitaxial layer 103 is 0.5–2.0 μm and that of the field oxide film 110 is 400–800 nm.

The U-trench isolation region is constituted with a U-trench 112, a silicon oxide film 113 which is a first film and is formed by thermal oxidation, a P type channel stopper 114, a BPSG film 115c which is a second film and formed by a CVD process, a silicon oxide film 116c which is a third film and formed by a CVD process, and a silicon nitride film 117 which is a fourth film and formed by a CVD process.

The U-trench 112 penetrates the field oxide film 110, the N type epitaxial layer 103 and the N+ type buried layer 102 and its bottom face exists in the P type silicon substrate 101. The trench is 0.6 to 1.2 μm wide and 3 to 6 μm deep.

The first film, that is, the silicon oxide film 113 on a wall of the U-trench is formed by thermal oxidation of exposed surface portions of the silicon substrate 101, the N type epitaxial layer 103 and the N+ buried layer 102. The thickness of the silicon oxide film 113 is 20 to 200 nm. The silicon oxide film 113 is to prevent boron and/or phosphor from diffusing from the BPSG film to the silicon substrate during various heat treatments subsequent to the deposition of the BPSG film and thus its thickness should be 20 nm or more. However, since stress generation due to volume expansion becomes large when the thickness exceeds 200 nm, the upper limit thereof should be determined in view of the fact.

Bottom and side faces of the second, BPSG films 115c directly contact with the silicon oxide film 113. Its top face is preferably positioned between the top face and bottom face of the field oxide film 110. In such case, the surface of the silicon substrate which is in contact with the U-trench 112 is prevented from being subjected to stress due to discontinuity of thermal expansion coefficient and, therefore, leakage current is reduced further. Density of phosphor and boron in the BPSG film 115c are 3 to 7 mol % and 7 to 15 mol respectively. The BPSG film 115c exhibits thermal reflow characteristics at a temperature around 800° to 950° C. As the second film, a PSG film can be used instead of the BPSG film.

A bottom face of the silicon oxide film 116a which is the third film is in direct contact with the top face of the BPSG film 115c, side faces thereof are in direct contact with a surface of the field oxide film 110 exposed in the wall of the U-trench 112 and a top face thereof is substantially coplanar with an upper end of the U-trench 112, that is, the top face of the field oxide film 110. With the existence of the silicon oxide film 116a, the top face of the field oxide film 110 and the upper end of the U-trench isolation region become copular. The silicon oxide film 116a prevents diffusion of boron and phosphor from the BPSG film 115c during subsequent various heat treatments and serves as a protection film for the BPSG film 115c against subsequent various etching steps. Since the silicon oxide film 116a has no thermal reflow characteristics, it can prevent reflow loss of the BPSG film 115c during subsequent various heat treatments.

The thickness of the silicon nitride film 117 which is the fourth film is 50 to 200 nm. The silicon nitride film 117 protects the third, silicon oxide film 116a against subsequent various etchings and ion injection. While the silicon nitride film 117 provides a sharp step at this stage, the step is substantially smoothened by subsequent formations of various films, and etch back steps.

As will be described in detail, heating in forming the U-trench isolation region is mainly performed to the BPSG film having thermal reflow characteristics. Therefore, there is no volume expansion thereof and thus leakage current due to thermal stress is aboided. Further since the film which is buried in the U-trench in the silicon substrate is the insulating film, factors contributing to increase of parasitic capacitance is removed. The flatness of the element isolation region and the possibility of reduction of the semiconductor element size will be described later.

Figure 5A:
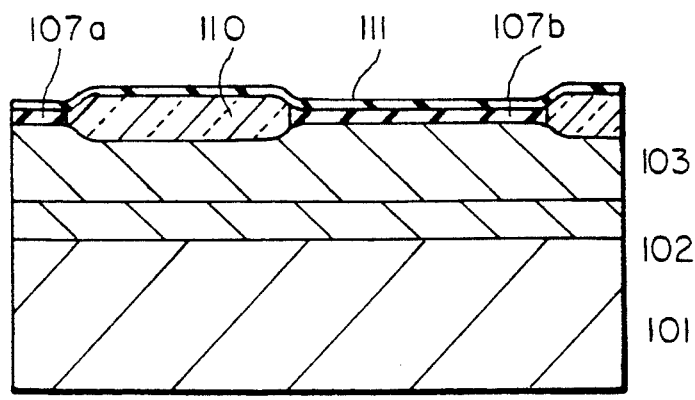
FIGS. 5A to 5G are cross sections for illustrating a fabrication of the semiconductor device according to the first embodiment of the present invention.

Referring to FIGS. 5A to 5G showing the fabrication method of the present semiconductor device, the N+ type buried layer 102 is formed on the surface of the P type silicon substrate 101. Although, in this embodiment, the N+ type buied layer 102 is formed on the whole surface of the silicon substrate 101 for the semiconductor device including bipolar transistor, it is possible to form the N+ type buried layer 102 in the form of islands. On the N+ type buried layer 102, a N type epitaxial layer 103 is formed. A surface of the N type epitaxial layer 103 is thermally oxidized to form a pad oxide film on which a silicon nitride film (not shown) is formed by CVD. The silicon nitride film is used as a mask for LOCOS process. A portion of the silicon nitride film on an area in which a field oxide film is to be formed is removed by etching and the field oxide film 110 is formed thereon by LOCOS. The silicon nitride film is removed by etching, leaving the pad oxide films 107a and 107b, etc. A silicon nitride film 111, 100 to 200 nm thick, is deposited on the whole surface by CVD (FIG. 5A).

Figure 5B:
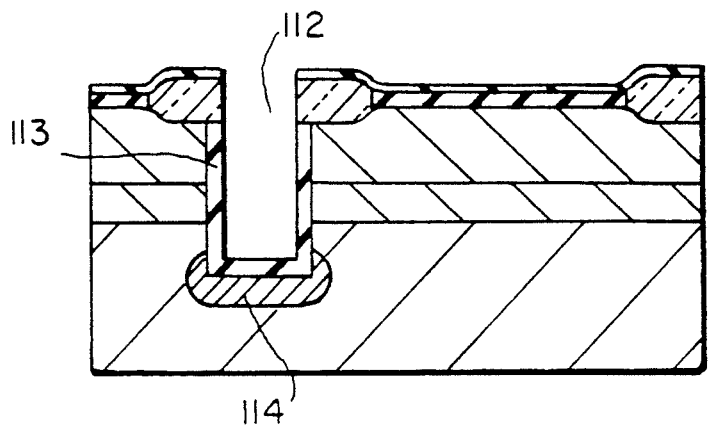

Then, a photo resist film (not shown) having an opening corresponding to an area in which a U-trench is to be formed is formed thereon. The silicon nitride film 111 and the field oxide film 110 are etched by RIE using $CHF_3+O_2$ or $CF_4+O_2$ with using the photo resist film as a mask. Thereafter, the N type epitaxial layer 103, the N+ buried layer 102 and the P type silicon substrate 101 are etched in sequence. By the series of etching steps, the U-trench 112 is formed. After the photo resist film is removed, the N epitaxial layer 103, in N+ buried layer 102 and the P type silicon substrate 101 exposed by the U-trench 112 are thermally oxidized to form the silicon oxide film 113 which is the first film. $BF_2$ ions are injected to the bottom face of the U-trench at injection energy of 30–50 KeV and dose of $1\times10^{13}$ to $1\times10^{14}$ cm$^{-2}$, resulting in the P type channel stopper 114 (FIG. 5B).

Figure 5C:
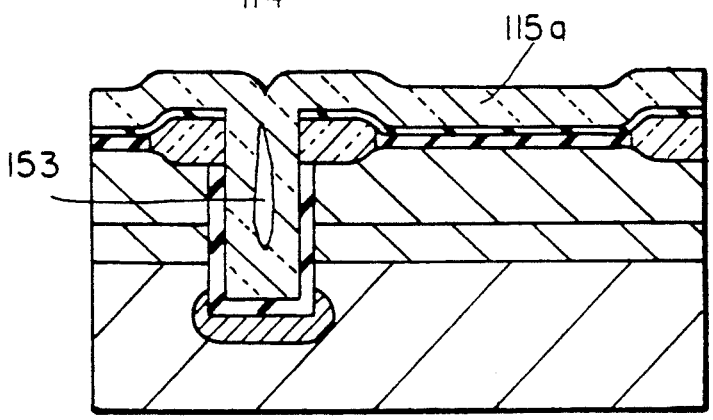

Then, the BPSG film 115a having thickness of 1 to 2 μm is deposited on the whole surface by LPCVD under condition of temperature of 700° to 800° C. and pressure of 0.8 to 1.5 Torr. At this stage, a cavity 153 may be formed in the U-trench (FIG. 5C).

Figure 5D:
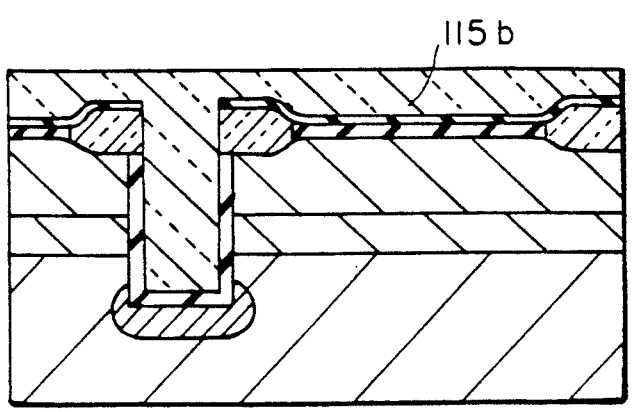

Then, by heat treating it in nitrogen atmosphere at 800° to 950° C., the BPSG film 115a reflows, resulting in a flattened BPSG film 115b. At this stage the cavity 153 disappears (FIG. 5D). In this heat treatment, stress generation is restricted to a low level by the thermal reflow characteristics of the BPSG film. In this stage, when the field oxide film is 500 nm thick, for example, a difference between thickness of the BPSG film 115b on the field oxide film 110 and on the pad oxide film 107 becomes 270 nm.

Figure 5E:
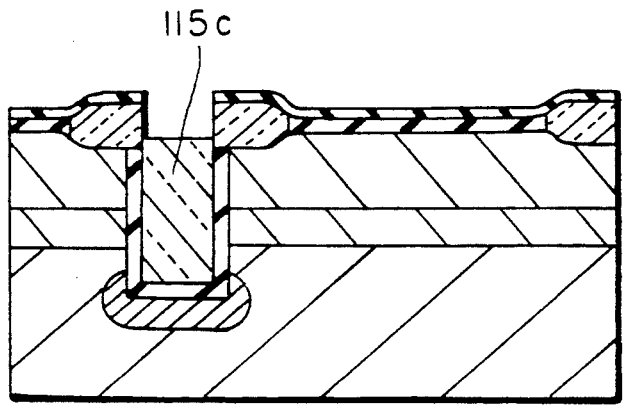

Then the BPSG film 115e is etched back, leaving the BPSG film 115c in only the U-trench 112 (FIG. 5E). This etch back is performed by wet etching with buffered HP or RIE using $CF_4+O_2$ (200 W, 0.35 Torr). In this case, the silicon nitride film 111 serves as a stopper for the etch back, that is, as a protection film for the field oxide film 110 and the pad oxide film 107e, etc. When the field oxide film is 500 nm thick, the top face of the BPSG film 115c can be made higher than the bottom face of the field oxide film 110 by about 200 nm. However, it can be lower than the bottom face of the field oxide film 110 without substantial problem.

Figure 5F:
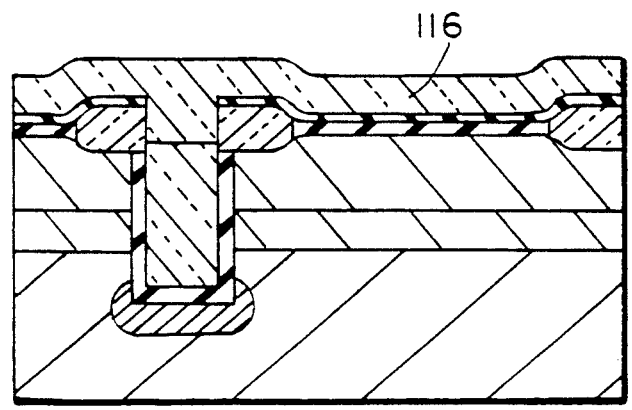

Then, the silicon oxide film 116 is deposited on the whole surface by CVD (FIG. 5F). The thickness of this silicon oxide film 116 is preferably a half of the width of the U-trench 112 or more. For example, when the width of the U-trench is 1.0 μm, the thickness of the silicon oxide film 116 may be 0.5 μm or more. It is possible to use a silicon nitride film instead of the silicon oxide film 116. In such case, it should be considered that such silicon nitride film having thickness of about 0.5 μm or more tends to crack by heating process.

Figure 5G:
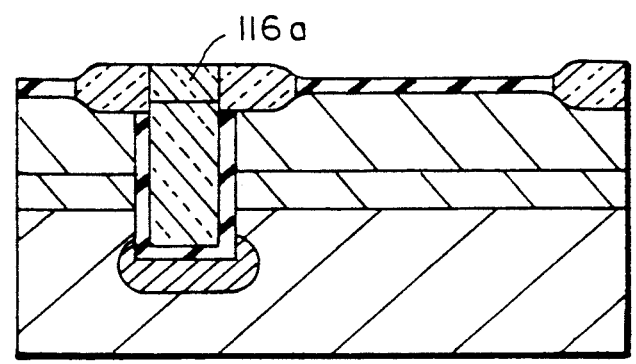

Then the silicon oxide film 116 is etched back and the silicon oxide film 116 whose top face is coplanar with the top face of the field oxide film buries the U-trench 112. In this step, the silicon nitride film 111 also serves as the stopper for the etch-back and as the protection film for the field oxide film 110 and the pad oxide film 107b, etc. The silicon nitride film 111 is then removed by wet etching with, for example, hot phosphoric acid (FIG. 5G).

Then, a silicon nitride film 50 to 200 nm thickness is deposited on the whole surface by CVD. The silicon nitride film is etched to form the silicon nitride film 117 (FIGS. 4A, 4B). The fourth film may be silicon oxide film formed by high temperature CVD, instead of the silicon nitride film 117. In such case, the thickness of the silicon oxide film should be 200 nm or more.

Effects of this embodiment will be described. A bipolar transistor was formed by using the element isolation region according to this embodiment. In FIGS. 4A and 4B, the N+ type collector plug region was formed in the N type epitaxial layer 103 in a position of the pad oxide film 107c, and a P type base region, a P+ type graft base region and an N+ type emitter region were formed in the N type epitaxial layer 103 in a position of the pad oxide film 107b. An area of the emitter region was 1×5 μm², $h_{FE}$=100 and a peripheral length of the U-trench 112 was 50 μm. For the purpose of measurement, an N+ type diffusion layer 103 was also formed in a position of the pad oxide film 107a. For purpose of comparison with the conventional element isolation region, a bipolar transistor having the same structure as that of the present embodiment was formed by using an element isolation region having a structure in which the BPSG film 115c, the silicon oxide film 116a and the silicon nitride-film 117 in FIGS. 4A and 4B were substituted by a polysilicon film and a silicon oxide film which correspond to the polysilicon film 252 and the field oxide film 210a in FIGS. 1A and 1B, respectively.

Figure 6:
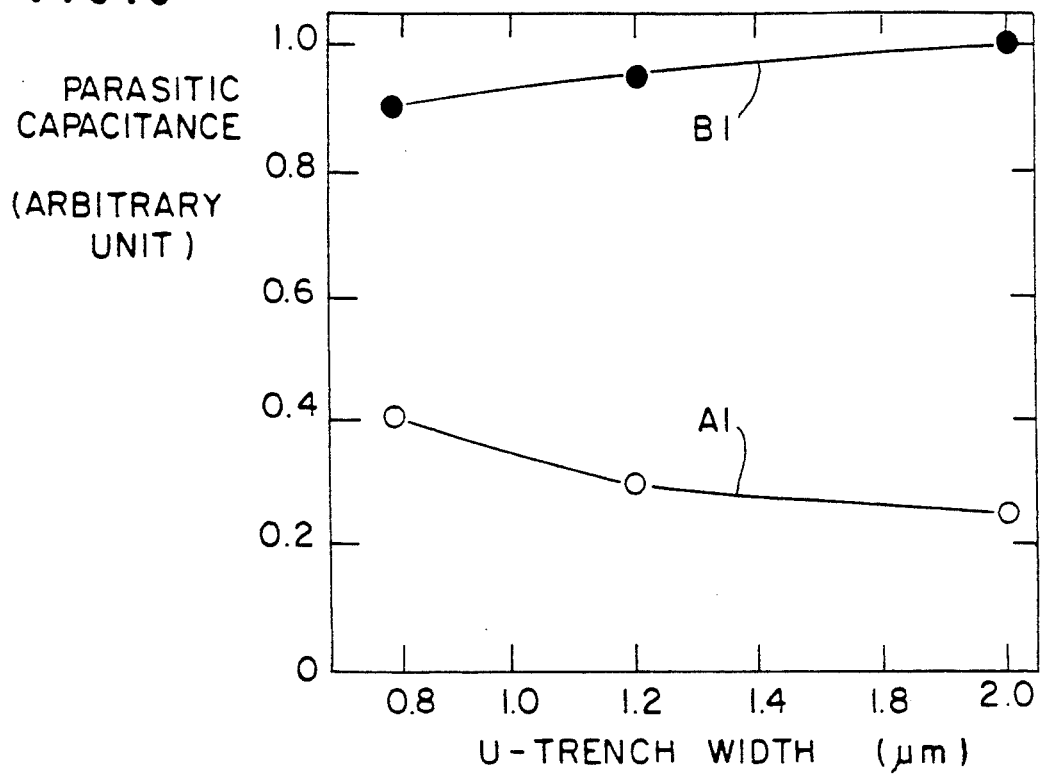
FIG. 6 is a graph showing a relation of parasitic capacitance to U-trench width in the semiconductor device according to the present invention.

FIG. 6 is a graph showing parasitic capacitance between collector regions separated by the U-trench isolation region with width of the U-trench being a variable. In detail, in the above-mentioned bipolar transistor, a capacitance between the N+ type collector plug region in the position of the pad oxide film 107c and the N+ diffusion type in the position of the pad oxide film 107a was measured. In FIG. 6, a line A1 shows a result of measurement of the present embodiment and a line B1 is that of the conventional structure. It is clear from FIG. 6 that parasitic capacitance in the present invention is substantially reduced when compared with the conventional structure. As shown by the line B1, parasitic capacitance increases with increase of the trench width in the conventional structure. This phonomenon may be due to that, when the width of the U-trench increases, the polysilicon film burying the tranch become dominant.

Figure 7:
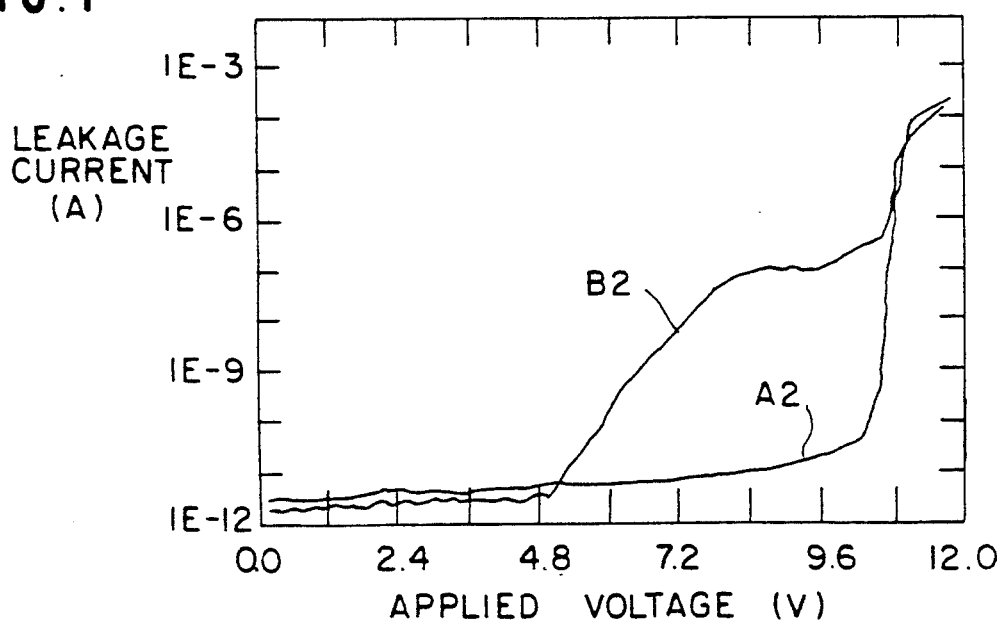
FIG. 7 is a graph showing a relation of applied voltage to leakage current in the semiconductor device according to the first embodiment of the present invention.

FIG. 7 is a graph showing leakage current between the collector region and the P type silicon substrate 101 when a positive voltage is applied to the N+ collector plug region. In FIG. 7, a line A2 shows a result of measurement of the present embodiment and a line B2 is for that of the conventional structure. It is clear from FIG. 7 that leakage current is substantially reduced by the present structure compared with the conventional structure. A sharp increase of leakage current on the line A2 around 11 volts corresponds to junction breakdown between the N+ type buried layer 102 and the P type silicon substrate 101.

The increase of leakage current observed in the conventional structure at a voltage lower than the junction breakdown voltage indicates that crystal defects occurred by thermal osidation of the polysilicon film extends up to the N+ type buried layer. Such crystal defects caused by volume expansion should be also considered for selection of a distance between the U-trench isolation region and a diffusion layer including a shallow P-N junction in the U-trench isolation region and the base region, etc.

Although not shown, the distance in the conventional structure must be 2.5 μm or more, while, it has been confirmed that the structure according to the present invention having the distance reduced to 1.0 μm operates normally. From this fact, it is clear that the present element isolation region is effective in reducing the size of semiconductor element.

Referring to FIGS. 8A to 8H which show fabrication steps of the first embodiment of the present invention, a BICMOS transistor is formed as described below.

First, N+ type buried layers 102a and 102b and a P+ type buried layer 104 are formed selectively on a surface of the P type silicon substrate 101 as islands. Impurity density of the P+ type buried layer 104 is $1 \times 10^{18}$ to $5 \times 10^{18}$ cm$^{-3}$. An N type epitaxial layer 103 is formed on the shole surface of the P type silicon substrate 101 including the N+ type buried layers 102a and 102b and the P+ type buried layer 104. An N type well 105 having a depth measured from the surface of the N type epitaxial 103 to the N+ buried layer 102b is formed by phosphor ion injection at dose of $5 \times 10^{12}$ to $4 \times 10^{13}$ cm$^{-3}$ and energy of 100–150 KeV. Before or after the formation of the N type well 105, a P type well 106 having a depth from the surface of the N type epitaxial layer 103 to the P+ type buried layer 104 is formed by boron ion injection at dose of $5 \times 10^{12}$ to $1 \times 10^{13}$ cm$^{-3}$ and energy of 100–150 KeV.

Figure 8A:
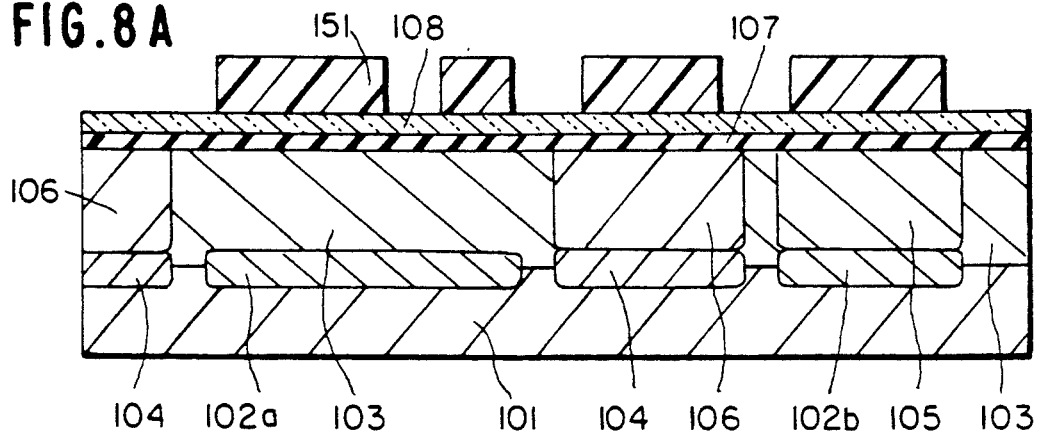
FIGS. 8A to 8H are cross sections illustrating application of the first embodiment to a fabrication of a semiconductor device composed of a BICMOS transistor.

The surface of the N type epitaxial layer 103 including the N well 105 and the P well 106 is thermally oxidized to form a pad oxide film 107. On a surface of the pad oxide film 107, a silicon nitride film 108 is deposited by CVD. Then, a photo resist film 151 having an opening corresponding to an area in which a field oxide film is to be formed is formed on a surface of the silicon nitride film 108 (FIG. 8A).

Figure 8B:
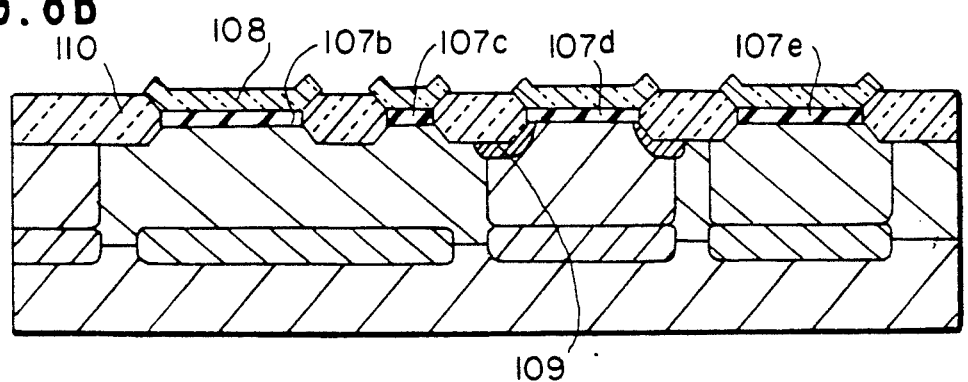

Then, the silicon nitride film 108 is etched with using the photo resist film 151 as a mask. Further, a photo resist film (not shown) having an opening corresponding to an area surrounding the P type well 106 is formed on the photo resist film 151. Boron is ion-injected to the wafer through the photo resist film not shown and the photo resist film 151 as masks at boron dose of about $1 \times 10^{13}$ cm$^{-2}$ and energy of about 150 KeV to form P type channel stopper 109. After these photo resist films are removed, a field oxide film 110 is formed by the LOCOS process. In this stage, pad oxide films 107b, 107c, 107d and 107e, etc. are left as islands (FIG. 8B).

Figure 8C:
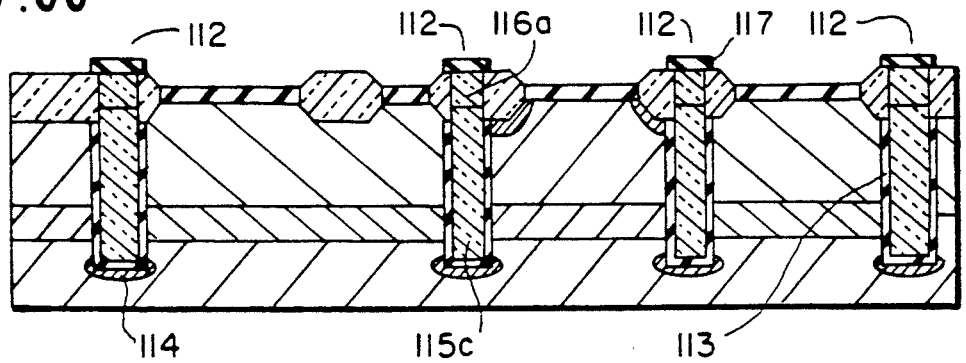

Then, the silicon nitride film 109 is removed by etching. Thereafter, a U-trench 112 is formed in the same manner as mentioned previously and thus a U-trench isolation region including the U-trench 112, the silicon oxide film 113, the P channel stopper 114, the BPSG film 115c, the silicon oxide film 116a and the silicon nitride film 117 is formed (FIG. 8C). With this U-trench isolation region, the N type layer 103, the N well 105 and the P well 106 are isolated from each other.

Figure 8D:
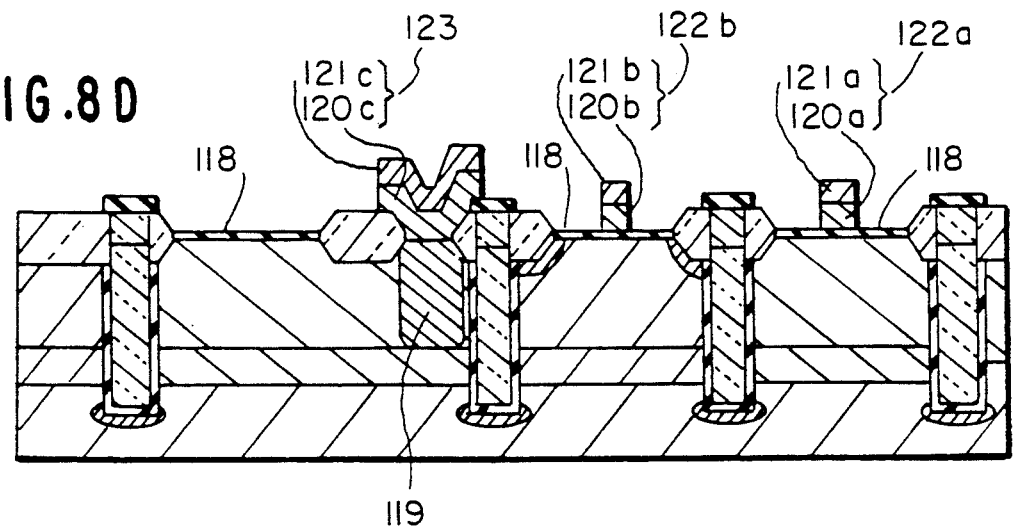

Then, the pad oxide films 107b, 107c, 107d and 107e, etc., are removed by etching and a gate oxide film 118 having thickness of 8–15 nm is formed on region previously occupied by the pad oxide film by thermal oxidation. Phosphor ion injection is performed to the area previously occupied by the pad oxide film 107c at phosphor dose of $1 \times 10^{16}$ to $3 \times 10^{16}$ cm$^{-2}$ and energy of about 70 KeV for an N+ type collector plug region 119 having depth from a surface of the N type epitaxial layer 103 to the N+ type buried layer 102a. After only a portion of the gate oxide film 118 on the N+ type collector plug region 119 is removed, an N type polysilicon film and a tungsten silicide film are deposited on the whole surface. The tungsten silicide film and the N+ type polysilicon film are etched in sequence to form a gate electrode 122a including the N+ type polysilicon film 120a and the tungsten silicide film 121a, a gate electrode 122h including the N+ type polysilicon film 120e and tungsten silicide film 121a and a collector lead electrode 123 including the N+ polysilicon film 120c and the tungsten silicide film 121c (FIG. 8D).

Figure 8E:
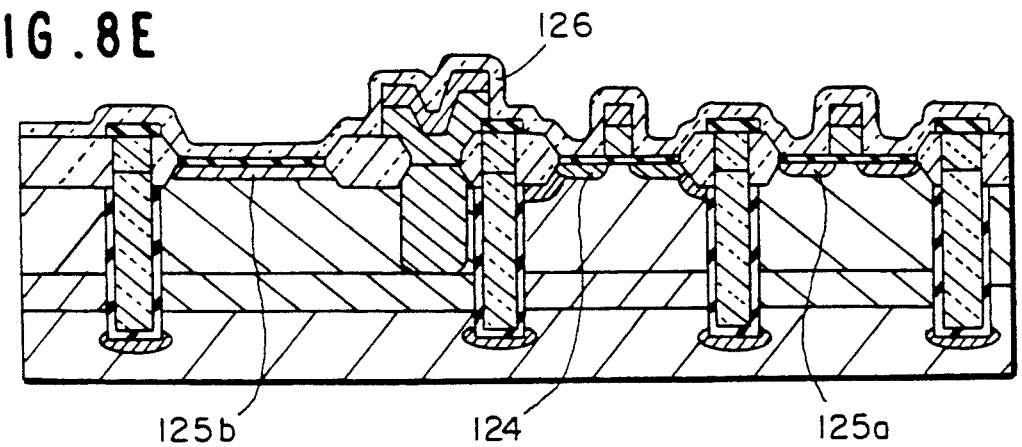

Then, phosphor is ion-injected through the gate electrode 122b as a mask to the P well 106 at a dose of $1 \times 10^{13}$ to $5 \times 10^{13}$ cm$^{-2}$ and energy of 15 to 40 KeV to form a N$^-$ type source-drain region 124. Before or after formation of the N$^-$ type source-drain region 124, boron is ion-injected through the gate electrode 122a as a mask to the N well 105 at a dose of $1 \times 10^{13}$ to $5 \times 10^{13}$ cm$^{-2}$ and energy of 15 to 40 KeV to form a P$^-$ type source-drain region 125a. A further boron ion injection is performed to the N type epitaxial layer 103 at a dose of $1 \times 10^{13}$ to $5 \times 10^{13}$ cm$^{-2}$ and energy of 10–30 KeV to form a P type base region 125b. Then, a silicon oxide film 126 having thickness of 100–300 nm is deposited on the whole surface by CVD (FIG. 8E).

Figure 8F:
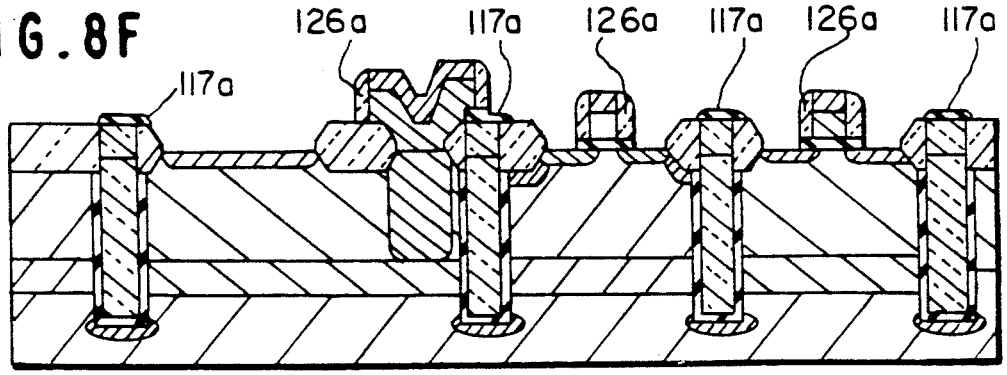

Then, the silicon oxide film 126 is etched back to form spacers 126a on side faces of the gate electrodes 122a and 122b and the collector lead electrode 123, respectively. In this stage, the gate oxide film 118 is left beneath the gate electrodes 122c and 122b and the spacers 126a, and the remaining gate oxide film 118 is removed by etching. Further, the silicon nitride film 117 is somewhat etched, resulting in a silicon nitride film 117a whose thickness is reduced and whose step portion is smoothened (FIG. 8F). With this structure of the silicon nitride film 117a, a wiring formed thereon through an interlayer insulating film, etc., is not subjected to breakage.

Figure 8G:
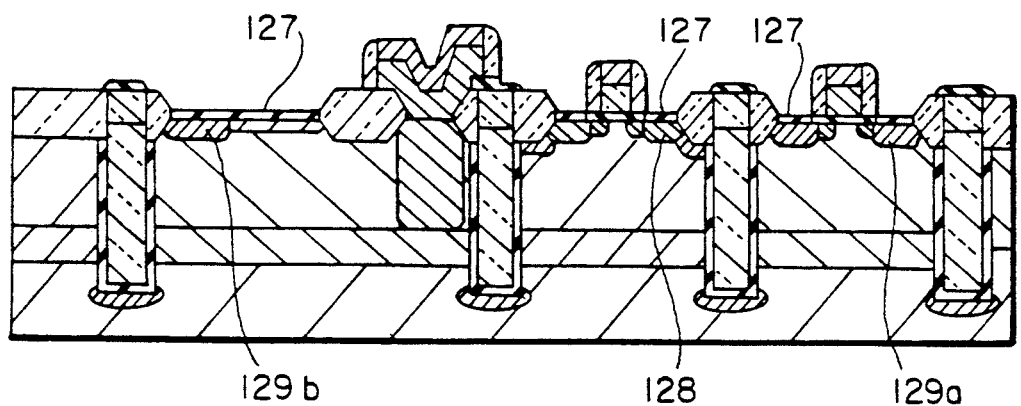
Figure 8H:
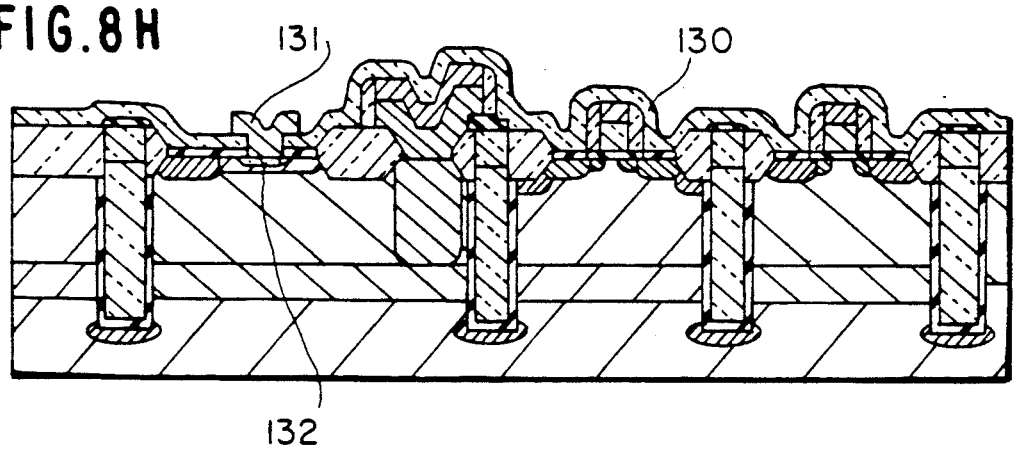

Then, a silicon oxide film 127 having thickness of about 20 nm is deposited on the whole surface by CVD. For simplicity of illustration, only a portion of the silicon oxide film 127 deposited on a silicon surface is shown. The silicon oxide film 127 serves to prevent disorder of crystal on the surface of the silicon substrate and damage thereof from occurring during ion injection at high dose. After a photo resist film (not shown) having an opening corresponding to a region surrounding the P type well 106 is formed, arsenic is ion-injected at a dose of $1 \times 10^{15}$ to $5 \times 10^{15}$ cm$^{-2}$ and energy of 30–70 KeV to form an N+ type source-drain region 124, completing formation of a N channel MOS transistor. After this photo-resist film is removed, a photo resist film (not shown) having openings corresponding to a region in which a P+ type graft base region is to be formed and a region which surrounds the N well 105 is formed and then BF$_2$ is ion-injected at dose of $1 \times 10^{15}$ to $5 \times 10^{15}$ cm$^{-2}$ and energy of 30 to 70 KeV to form the P+ type graft base region 125b and the P+ type source-drain region 125a. With this ion injection, the fabrication of the P channel MOS transistor completes (FIG. 8G).

Then, after the last mentioned photo resist film is removed, a silicon oxide film 130 having thickness of about 200 nm is deposited on the whole surface by CVD. Portions of the silicon oxide films 130 and 127 corresponding to a region in which N+ type emitter are to be formed are removed by etching and an N+ type polysilicon film containing arsenic is formed on the whole surface. A polysilicon emitter electrode 131 is formed by etching the N+ type polysilicon film. Arsenic in the polysilicon emitter electrode 131 diffuses to the P+ type base region 125b by heat treating it in nitrogen atmosphere, resulting in a N+ type emitter region 132. With this step a fabrication of a vertical NPN bipolar transistor is completed and thus the formation of the BiCMOS transistor is completed.

FIGS. 9A to 9D show fabrication steps of a second embodiment of the present invention which starts from the state shown in FIG. 5B for the first embodiment.

Figure 9A:
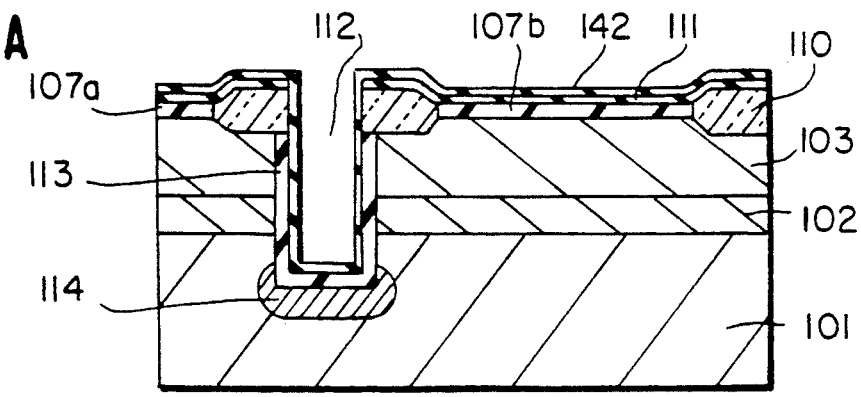
FIGS. 9A to 9D are cross sections showing fabrication steps of a second embodiment of the present invention.
Figure 9B:
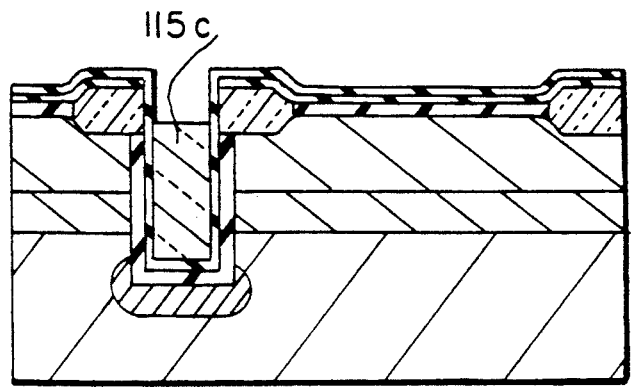
Figure 9C:
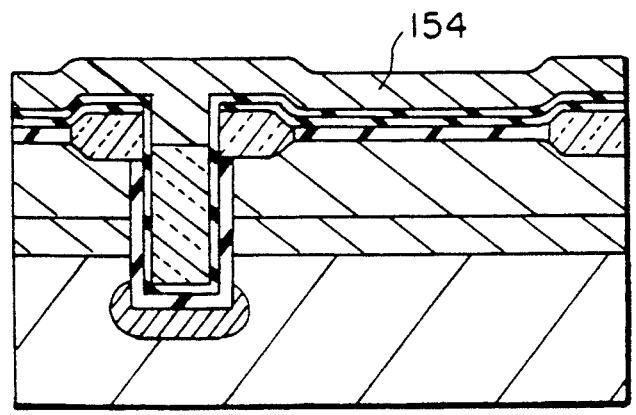
Figure 9D:
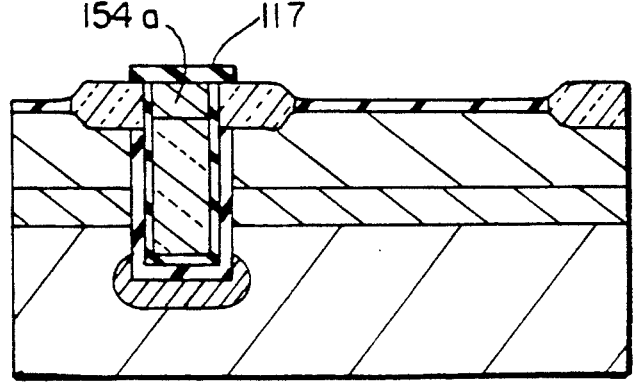

In FIG. 9A, a silicon nitride film 142 having thickness of 20 to 100 nm is formed on a silicon nitride film 111 on a structure having a U-trench 112 formed in the same manner as that in the first embodiment as shown in FIG. 5B, by CVD. Then, a BPSG film 115c is formed in the U-trench 112 in the same manner as shown in FIG. 5C to 5E (FIG. 9B). Then, a non-doped polysilicon film 154 is deposited on the whole surface by CVD. The thickness of the non-doped polysilicon film 154 is preferably a half of the width of the U-trench 112 or more (FIG. 9C). Then, the polysilicon film 154 is etched back by SF$_6$ dry-etching to bury the U-trench 112 with a non-doped polysilicon film 154a. Then, the silicon nitride films 142 and 111 are removed by, for example, wet etching. Then, a silicon nitride film 117a is formed as in the first embodiment (see FIGS. 4A and 4B), resulting in an element isolation region of the second embodiment (FIG. 9D). The second embodiment provides the same effect as the first embodiment in breakage current, etc.

Figure 10:
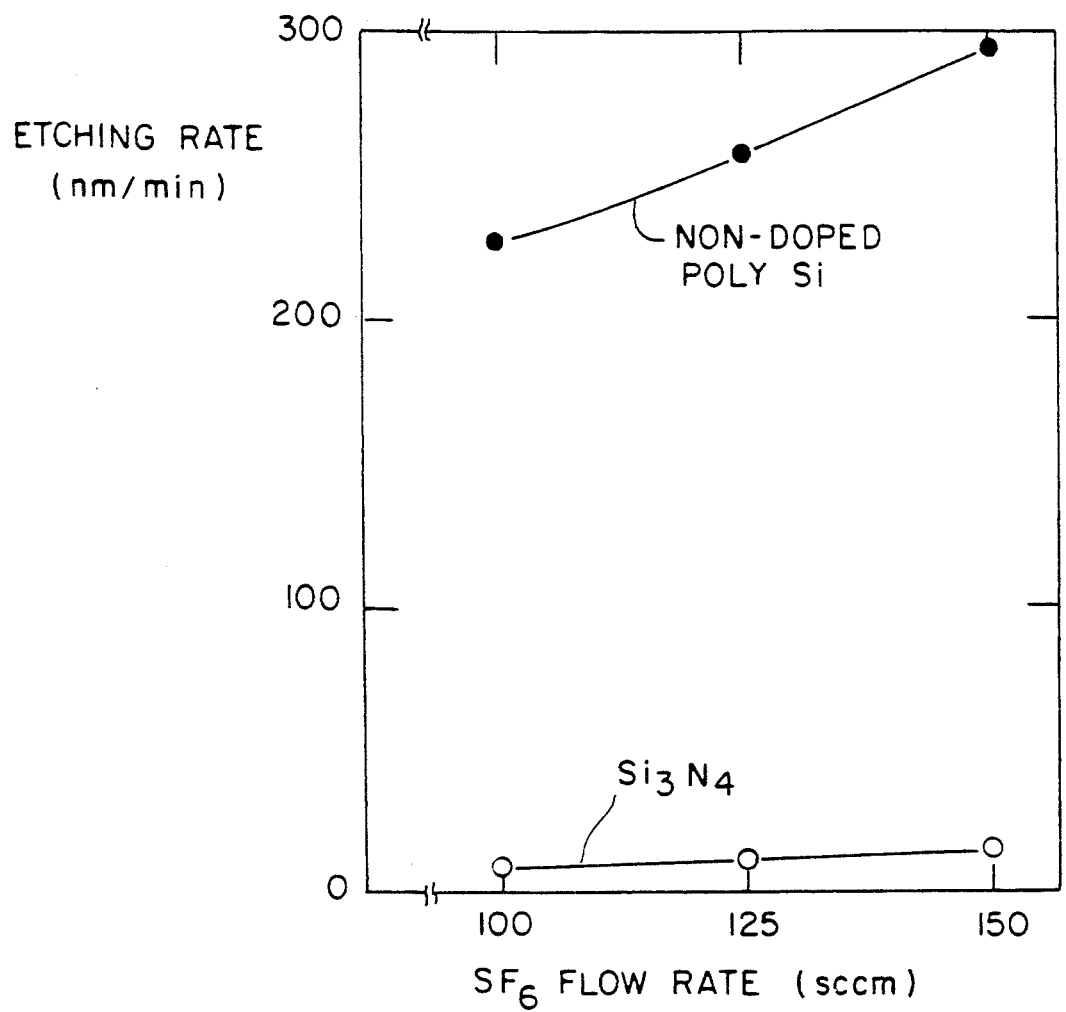
FIG. 10 is a graph showing a relation of flow rate of SF etching gas to etching rate in fabrication of the second embodiment.

SF$_6$ dry etching will be described with reference to FIG. 10 which is a graph showing a relation of etching rate of the non-doped polysilicon film and silicon nitride to flow rate of SF$_6$ gas. The etching is performed under condition of nitrogen gas flow rate of 50 sccm (standard cubic cm per minute), power of 250 W and pressure of 250 m Torr. As will be clear from FIG. 10, etching rate of the non-doped polysilicon film is 20–30 times that of the silicon nitride films. For this reason, the above-mentioned etch-back can be done precisely. The preciseness of the etchback is higher than the fabrication preciseness of the silicon oxide film 116a in the first embodiment. In this second embodiment, one of reasons for the use of the non-doped polysilicon film 154a is this fabrication preciseness. Another reason is that when the first polysilicon film contains impurity, it becomes a floating wiring, the doped polysilicon film should not be used.

The silicon nitride film 142 is to prevent the polysilicon film 154a from being oxidized by H$_2$ and O$_2$, etc., passing through the field oxide film 110 to the non-doped polysilicon film 154a during thermal oxidation in later steps.

Figure 11A:
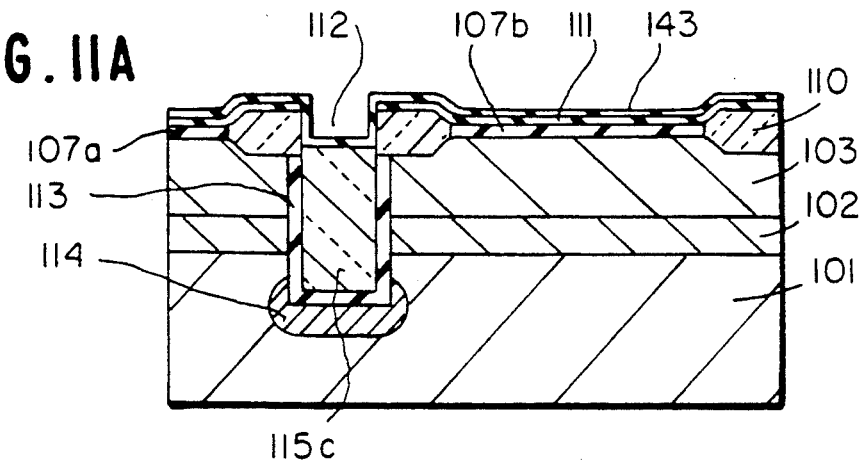
FIGS. 11A to 11C are cross sections showing fabrication steps of a third embodiment of the present invention.
Figure 11B:
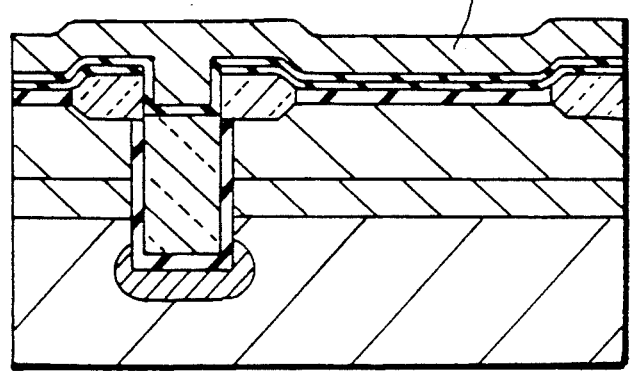
Figure 11C:
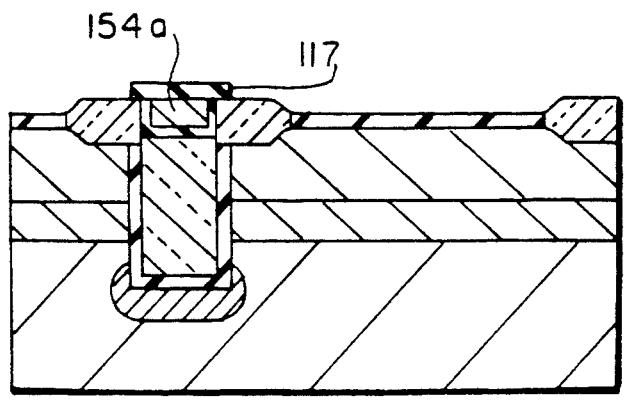

FIGS. 11A to 11C show a fabrication method according to a third embodiment of the present invention, which starts from the state shown in FIG. 5E. A silicon nitride film 143 having thickness of 20–100 nm is formed on a surface of a U-trench 112 including a top face of a BSPG film 115 and on a surface of a silicon substrate film 111 by CVD (FIG. 11A). Then, a non-doped polysilicon film 154 is deposited on the whole surface by CVD. The thickness of the non-doped polysilicon film 154 is preferably a half of the width of the U-trench 112 or more (FIG. 11B). Then, as in the second embodiment, the non-doped polysilicon film 154 is etched back by $SF_6$ dry-etching process to bury the U-trench 112 with non-doped polysilicon film 154a. The silicon nitride films 143 and 111 are removed by, for example, wet etching. Then, as in the first embodiment (FIGS. 4A–4B), a silicon nitride film 117a is formed, resulting in an element isolation region (FIG. 11C). The third embodiment provides similar effect of leakage current, etc. to those obtainable by the first and second embodiments.

In the third embodiment using the silicon nitride film 143, it is possible to completely prevent an impurity diffusion from the BPSG film 115c to the non-doped polysilicon film 154a.

Although the invention has been described with reference to specific embodiments, the description is not meant to be construed in a limiting sense. Various modifications of the disclosed embodiment, as well as other embodiments of the present invention, will become apparent to persons skilled in the art upon reference to the description of the present invention. It is therefore contemplated that the appended claims will cover any modifications or embodiments as fallen within the true scope of the present invention.

What is claimed:
1. A semiconductor device having an element isolation region including a field oxide film of a local oxidation of silicon (LOCOS) type formed in a surface of a silicon substrate, a U-trench provided in said silicon substrate such that said U-trench penetrates said field oxide film with a bottom face of said U-trench reaching at least said silicon substrate, a channel stopper provided in a portion of said silicon substrate exposed on said bottom face of said U-trench, a first film in a form of an insulating film provided in another portion of said silicon substrate exposed on a wall of said U-trench, and a second film buried in said U-trench, said semiconductor device comprising:
said first film being a silicon oxide film formed by thermal oxidation of said another portion of said silicon substrate;
said second film being an insulating film having thermal reflow characteristics;
a third film having non-thermal reflow characteristics, said third film having a top face substantially coplanar with a top face of said field oxide film and a bottom face connected to a top face of said second film; and
a fourth film in a form of an insulating film connected to said top face of said third film at an upper end of said U-trench and covering said U-trench.

2. The semiconductor device claimed in claim 1, wherein said second film is a phosphorus silicate glass (PSG) film or a borophosphorus silicate glass (BPSG) film.

3. The semiconductor device claimed in claim 1, wherein said top face of said second film is positioned between said top face of said field oxide film and a bottom face of said field oxide film.

4. The semiconductor device claimed in claim 1, wherein said third film is a silicon oxide film formed by Chemical Vapor deposition (CVD) or a non-doped polysilicon film formed by CVD.

5. The semiconductor device claimed in claim 1, wherein said fourth film is a silicon nitride film formed by CVD or a silicon oxide film formed by high temperature CVD.

6. The semiconductor device claimed in claim 1, wherein said third film is a non-doped polysilicon film, and further comprising a fifth film in a form of a silicon nitride film formed by CVD, said fifth film covering a portion of said field oxide film exposed in said U-trench and a top face of said first film.

7. The semiconductor device claimed in claim 1, wherein said third film is a non-doped polysilicon film, and further comprising a sixth film in a form of a silicon nitride film formed by CVD, said sixth film being inserted between said third film and said top face of said second film.

8. The semiconductor device claimed in claim 1, wherein said silicon substrate is constituted with a silicon substrate of one conductivity type and a well of the other conductivity type, said U-trench penetrates side faces of said well of the other conductivity type and said bottom face of said U-trench is positioned below a bottom face of said well of the other conductivity type.

9. The semiconductor device claimed in claim 1, wherein said silicon substrate is composed of a silicon substrate of one conductivity type, a well of the other conductivity type and a well of the one conductivity type, said U-trench penetrates side faces of said well of the one conductivity type and said well of the other conductivity type and bottom face of said U-trench is positioned below bottom faces of said wells of the one conductivity type and the other conductivity type.

10. The semiconductor device claimed in claim 1, wherein said silicon substrate is composed of a silicon substrate of one conductivity type, a buried type of the other conductivity type and an epitaxial layer of the other conductivity type, and said U-trench penetrates said buried layer of the other conductivity type.

11. The semiconductor device claimed in claim 1, wherein said silicon substrate is constituted with a silicon substrate of one conductivity type, a buried layer of the other conductivity type, a buried layer of the one conductivity type and an epitaxial layer of the one conductivity type and said U-trench penetrates said buried layer of the other conductivity type and said buried layer of the one conductivity type.

12. The semiconductor device claimed in claim 1, wherein said silicon substrate is constituted with a silicon substrate of one conductivity type, a buried layer of the other conductivity type, a buried layer of the one conductivity type, an epitaxial layer of the other conductivity type and a well connected to said buried layer of the one conductivity type and formed in said epitaxial layer of the other conductivity type formed on said buried layer of the one conductivity type, and wherein said U-trench penetrates side faces of said well of the one conductivity type, said buried layer of the other conductivity type and said buried layer of the one conductivity type.

13. The semiconductor device claimed in claim 1, wherein said silicon substrate is constituted with a silicon substrate of one conductivity, a buried layer of the other conductivity, a buried layer of the one conductivity type, an epitaxial layer of the other conductivity type, a well of the one conductivity type provided in said epitaxial layer of said the other conductivity type formed on said buried layer of the one conductivity type and connected to said buried layer of the one conductivity type and a well of the other conductivity type provided in said epitaxial layer of the other conductivity type on said buried layer of the other conductivity type and connected to said buried layer of the other conductivity type in a portion of said buried layer of the other conductivity type, and wherein said U-trench penetrates side faces of said wells of the one conductivity type and the other conductivity type and said buried layers of the one conductivity type and the other conductivity type.

* * * * *

UNITED STATES PATENT AND TRADEMARK OFFICE
CERTIFICATE OF CORRECTION

PATENT NO. : 5,306,940
DATED : April 26, 1994
INVENTOR(S) : Toru YAMAZAKI

It is certified that error appears in the above-indentified patent and that said Letters Patent is hereby corrected as shown below:

Col. 2, line 50, delete "epitacial" insert --epitaxial--.
Col. 3, line 6, delete "buring" insert --burying--;
Col. 3, line 18, delete "y." insert --Y.--.
Col. 6, line 38, delete "tranch" insert --trench--.
Col. 7, line 31, delete "though" insert --through--;
Col. 7, line 53, delete "drawing" insert --drawings--;
Col. 7, line 68, delete "porblem" insert --problem--.
Col. 11, line 31, after "15 mol" insert -- % --;
Col. 11, line 44, delete "copular" insert --coplanar--;
Col. 11, line 64, delete "aboided" insert --avoided--.
Col. 12, line 7, delete "buied" insert --buried--.
Col. 13, line 63, delete "phonomenon" insert --phenomenon--;
Col. 13, line 65, delete "tranch become" insert --trench becomes--.
Col. 14, line 14, delete "osidation" insert --oxidation--;

UNITED STATES PATENT AND TRADEMARK OFFICE
CERTIFICATE OF CORRECTION

PATENT NO. : 5,306,940
DATED : April 26, 1994
INVENTOR(S) : Toru YAMAZAKI

It is certified that error appears in the above-indentified patent and that said Letters Patent is hereby corrected as shown below:

Col. 14, line 36, delete "shole" insert --whole--.

Signed and Sealed this

Twenty-fifth Day of October, 1994

Attest:

BRUCE LEHMAN

Attesting Officer          Commissioner of Patents and Trademarks